United States Patent [19]

Pasch

[11] Patent Number: 5,252,503
[45] Date of Patent: Oct. 12, 1993

[54] TECHNIQUES FOR FORMING ISOLATION STRUCTURES

[75] Inventor: Nicholas F. Pasch, Pacifica, Calif.

[73] Assignee: LSI Logic Corporation, Milpitas, Calif.

[21] Appl. No.: 979,305

[22] Filed: Nov. 20, 1992

Related U.S. Application Data

[60] Division of Ser. No. 748,853, Aug. 22, 1991, which is a continuation-in-part of Ser. No. 711,624, Jun. 6, 1991.

[51] Int. Cl.$^5$ .......................................... H01L 21/265
[52] U.S. Cl. ........................................ 437/33; 437/31; 437/61; 437/72; 437/228; 148/DIG. 135
[58] Field of Search ........................ 437/31, 33, 61, 64, 437/65, 72, 70, 62, 67, 69, 228, 946; 148/DIG. 135; 156/645

[56] References Cited

U.S. PATENT DOCUMENTS

| | | | |
|---|---|---|---|
| Re. 32,207 | 7/1986 | Levinstein et al. | 427/85 |
| 3,479,237 | 11/1969 | Bergh et al. | 156/11 |
| 4,019,248 | 4/1977 | Black | 29/583 |
| 4,038,110 | 7/1977 | Feng | 148/187 |
| 4,256,534 | 3/1981 | Levinstein et al. | 156/643 |
| 4,276,557 | 6/1981 | Levinstein et al. | 357/67 |
| 4,470,874 | 9/1984 | Bartush et al. | 156/643 |
| 4,484,979 | 11/1984 | Stocker | 156/643 |
| 4,490,209 | 12/1984 | Hartman | 156/643 |
| 4,493,142 | 1/1985 | Hwang | 29/575 |
| 4,508,815 | 4/1985 | Ackmann et al. | 430/314 |
| 4,520,041 | 5/1985 | Aoyama et al. | 427/88 |
| 4,541,168 | 9/1985 | Galie et al. | 29/579 |
| 4,545,852 | 10/1985 | Barton | 156/643 |
| 4,609,809 | 9/1986 | Yamaguchi et al. | 219/121 |
| 4,612,701 | 9/1986 | Cox | 437/72 |
| 4,666,553 | 5/1987 | Blumenfeld et al. | 156/643 |
| 4,671,851 | 6/1987 | Bayer et al. | 437/67 |
| 4,708,770 | 11/1987 | Pasch | 156/662 |
| 4,758,306 | 7/1988 | Cronin et al. | 156/643 |
| 4,775,550 | 10/1988 | Chu et al. | 427/38 |
| 4,789,648 | 12/1988 | Chow et al. | 437/225 |
| 4,851,097 | 7/1989 | Hattori et al. | 204/192.33 |
| 4,876,217 | 10/1989 | Zdebel | 437/67 |
| 4,876,223 | 10/1989 | Yoda et al. | 437/228 |
| 4,879,257 | 11/1989 | Patrick | 437/195 |

(List continued on next page.)

FOREIGN PATENT DOCUMENTS

| | | |
|---|---|---|
| 0223920A2 | 6/1987 | European Pat. Off. |
| 0224013A2 | 6/1987 | European Pat. Off. |
| 58-153351 | 9/1983 | Japan |
| 61-137344 | 6/1986 | Japan |
| 60-260455 | 11/1987 | Japan |
| 63-16637 | 1/1988 | Japan |
| PCT/US89/-02929 | 4/1989 | PCT Int'l Appl. |
| 2186424A | 8/1987 | United Kingdom |

OTHER PUBLICATIONS

IBM Technical Disclosure Bulletin, vol. 29, No. 2, Jul. 1986, p. 577.
IBM Technical Disclosure Bulletin, vol. 27, No. 8, Jan. 1985, pp. 4700–4701.
IBM Technical Disclosure Bulletin, vol. 27, No. 6, Nov. 1984, pp. 3242–3243.
Thin Film Process, by Vossen et al., pp. 497–521, 1978.

*Primary Examiner*—Brian E. Hearn
*Assistant Examiner*—Tuan Nguyen
*Attorney, Agent, or Firm*—Gerald E. Linden; Michael D. Rostokes

[57] ABSTRACT

Various techniques of forming isolation structures between adjacent diffusion regions are disclosed. In one technique, a thermally-grown oxide isolation structure is gouged out, and subsequent poly extending into the gouged out isolation structure is substantially level with the diffusion region. In another technique, a trench (bathtub) is formed, lightly oxidized, overfilled with polysilicon or amorphous silicon, gouged out, and thermally treated to form a substantially planar isolation structure. In another technique, an isolation structure exhibiting bird's-heads and bird's-beaks is polished until the bird's-beaks are removed. Gouging of the diffusion area may be permitted to occur. A bipolar transistor structure can be formed in the gouged diffusion area, and will exhibit reduced spacing between the intrinsic base and collector without proportionally reduced spacing between the extrinsic base and the collector.

2 Claims, 4 Drawing Sheets

5,252,503

Page 2

U.S. PATENT DOCUMENTS

| | | | |
|---|---|---|---|
| 4,879,258 | 11/1989 | Fisher | 437/225 |
| 4,892,614 | 1/1990 | Chapman et al. | 156/643 |
| 4,892,845 | 1/1990 | Bridges | 437/195 |
| 4,894,351 | 1/1990 | Batty | 437/190 |
| 4,897,150 | 1/1990 | Dooley et al. | 156/628 |
| 4,897,364 | 1/1990 | Nguyen et al. | 437/69 |
| 4,897,365 | 1/1990 | Baldi et al. | 437/69 |
| 4,898,841 | 2/1990 | Ho | 437/200 |
| 4,900,689 | 2/1990 | Bajor et al. | 437/31 |
| 4,901,132 | 2/1990 | Kuwano | 357/43 |
| 4,902,641 | 2/1990 | Koury, Jr. | 437/62 |
| 4,903,109 | 2/1990 | Kooi | 357/50 |
| 4,903,112 | 2/1990 | Strack et al. | 357/55 |
| 4,905,062 | 2/1990 | Esquivel et al. | 357/23.5 |
| 4,905,073 | 2/1990 | Chen et al. | 357/67 |
| 4,906,592 | 3/1990 | Merenda et al. | 437/190 |
| 4,906,593 | 3/1990 | Shioya et al. | 437/192 |
| 4,906,595 | 3/1990 | van der Plas et al. | 437/239 |
| 4,907,063 | 3/1990 | Okada et al. | 357/54 |
| 4,907,066 | 3/1990 | Thomas et al. | 357/71 |
| 4,908,683 | 3/1990 | Matlock et al. | 357/23.11 |
| 4,910,155 | 3/1990 | Cote et al. | 437/8 |
| 4,910,168 | 3/1990 | Tsai | 437/193 |
| 4,912,062 | 3/1990 | Verma | 437/69 |
| 4,914,056 | 4/1990 | Okumura | 437/192 |
| 4,916,087 | 4/1990 | Tateoka et al. | 437/67 |
| 4,916,494 | 4/1990 | Flohrs et al. | 357/13 |
| 4,916,514 | 4/1990 | Nowak | 357/68 |
| 4,918,510 | 4/1990 | Pfiester | 357/42 |
| 4,920,070 | 4/1990 | Mukai | 437/173 |
| 4,920,401 | 4/1990 | Sakai et al. | 357/59 |
| 4,924,284 | 5/1990 | Beyer et al. | 357/49 |
| 4,927,780 | 5/1990 | Roth et al. | 437/69 |
| 4,929,996 | 5/1990 | Hutter | 357/34 |
| 4,931,409 | 6/1990 | Nakajima et al. | 437/63 |
| 4,933,303 | 6/1990 | Mo | 437/190 |
| 4,935,095 | 6/1990 | Lehrer | 156/644 |
| 4,935,378 | 6/1990 | Mori | 437/43 |
| 4,935,804 | 6/1990 | Ito et al. | 357/71 |
| 4,939,105 | 7/1990 | Langley | 437/228 |
| 4,940,507 | 7/1990 | Harbarger | 156/636 |
| 4,942,137 | 7/1990 | Siyan et al. | 437/63 |
| 4,944,836 | 7/1990 | Beyer et al. | 156/645 |
| 4,946,500 | 8/1990 | Van Laarhoven | 156/643 |
| 4,946,800 | 8/1990 | Li | 437/65 |
| 4,948,742 | 8/1990 | Nishimura et al. | 437/24 |
| 4,950,617 | 8/1990 | Kumagai et al. | 437/41 |
| 4,952,274 | 8/1990 | Abraham | 156/643 |
| 4,952,524 | 8/1990 | Lee et al. | 437/67 |
| 4,952,525 | 8/1990 | van der Plas | 437/69 |
| 4,954,214 | 9/1990 | Ho | 156/628 |
| 4,954,458 | 9/1990 | Reid | 437/51 |
| 4,954,459 | 9/1990 | Aanzino et al. | 437/228 |
| 4,956,313 | 9/1990 | Cote et al. | 437/203 |
| 4,956,314 | 9/1990 | Tam et al. | 437/241 |
| 4,957,873 | 9/1990 | Ojha | 437/20 |
| 4,959,325 | 9/1990 | Lee et al. | 437/30 |
| 4,963,951 | 10/1990 | Adler et al. | 357/23.7 |
| 4,966,861 | 10/1990 | Mieno et al. | 437/99 |
| 4,980,019 | 12/1990 | Baerg et al. | 156/643 |
| 5,001,075 | 3/1991 | Boland et al. | 437/33 |
| 5,006,482 | 4/1991 | Kerbaugh et al. | 437/67 |
| 5,011,788 | 4/1991 | Kawaji et al. | 437/66 |
| 5,015,602 | 5/1991 | van der Plas et al. | 437/67 |
| 5,091,289 | 2/1992 | Cronin et al. | 430/312 |
| 5,091,330 | 2/1992 | Cambou et al. | 437/62 |
| 5,094,972 | 3/1992 | Pierce et al. | 437/67 |
| 5,102,822 | 4/1992 | Calligaro | 437/67 |
| 5,104,482 | 4/1992 | Monkowski et al. | 156/643 |
| 5,110,749 | 5/1992 | Ikeda | 437/31 |
| 5,128,271 | 7/1992 | Bronner et al. | 437/31 |
| 5,142,828 | 9/1992 | Curry, II | 51/281 |

TECHNIQUES FOR FORMING ISOLATION STRUCTURES

CROSS-REFERENCE TO RELATED APPLICATIONS

This application is a division of U.S. patent application Ser. No. 07/748,853 filed Aug. 22, 1991, which is a continuation-in-part of commonly-owned, copending U.S. patent application Ser. No. 711,624, entitled TRENCH PLANARIZATION TECHNIQUES and filed on Jun. 6, 1991 by Schoenborn and Pasch.

TECHNICAL FIELD OF THE INVENTION

The present invention relates to polishing techniques for semiconductor devices, more particularly to the polishing of field (isolation) oxide regions between (i.e., surrounding) active (diffusion) regions.

BACKGROUND OF THE INVENTION

Electrical isolation of semiconductor integrated transistors from one another can be achieved by laterally (in the plane of the wafer) isolating "active" regions of the device with insulating material. Two techniques are common: 1) selectively oxidizing wafer silicon surrounding the active region (known as "LOCOS", or Local Oxidation of Silicon), or 2) depositing insulating material, such as silicon dioxide ("oxide") in a trench (or "bathtub") around the active region. The former, selectively oxidizing to form a field (isolation) oxide region, is discussed in the main hereinafter.

One known technique of forming isolation oxide around a diffusion area is Local Oxidation Of Silicon ("LOCOS"). In the typical LOCOS process, a mask (e.g., nitride) is applied to the wafer, a trench is etched, the wafer is heated, and oxide "grows" predominantly in the trench. In this manner, an isolation structure is created that extends both into the wafer and some height above the wafer. In a "semi-recessed" version of this process, the height of the oxide structure above wafer level is approximately 45% of the total thickness of the as-grown oxide. In a "fully-sunk" ("fully-recessed") version of this process, the isolation structure can grow to a height of about 25-45% of the total oxide thickness, above wafer level. No matter how it is grown, the resulting oxide structure has a prominent portion above wafer level, resulting in an irregular top surface wafer topography. It is known to polish the wafer to remove the prominent portion of the isolation structure, but this usually involves steps ensuring that the isolation oxide structure does not become gouged out below wafer level, especially if a polish stop (e.g., nitride cap or mask layer) is employed to protect the diffusion region.

LOCOS is described in U.S. Pat. Nos. 4,897,364, 4,903,109 and 4,927,780, incorporated by reference herein.

Subsequent deposition of polysilicon ("poly"), which may typically follow the LOCOS process, usually places poly on top of the diffusion areas and on top of the LOCOS oxide. The top of the poly is typically 3000-4000 Å above the level of the diffusion area, simply because of the normal poly thickness. The poly that is located above the LOCOS region is another 4000-5000 Å above the level of the top of the poly over the diffusion region, simply because of the prominence (not polished) of the oxide in the LOCOS area. For this reason, the difference in height between the diffusion area and the poly over the LOCOS area can be as great as 8000 Å. This large difference in height is very undesirable, but is the natural consequence of the process as currently implemented.

FIG. 1 graphically illustrates the situation, and shows a semiconductor device 110 having a silicon wafer 112, a diffusion area (active region) 114 and field oxide areas (e.g., LOCOS) 116 adjacent the diffusion region 114. Inasmuch as the field oxide areas 116 are thermally formed, they exhibit a raised topography at the wafer surface. U.S. Pat. Nos. 4,892,845, 4,897,150, 4,918,510, 4,935,378, 4,935,804, 4,954,214, 4,954,459 and 4,966,861 illustrate structures of this general type, and are incorporated by reference herein.

A polysilicon layer 118 is deposited over the diffusion area 114, and extends from the diffusion region 114 to at least partially over the adjacent field oxide areas 116. The polysilicon layer is shown segmented, discontinuous at the center of the diffusion region 114, but is can be contiguous and extend entirely over the diffusion region. An overlying, generally-conformal insulating oxide layer 120 is deposited over the wafer. Vias 122a and 122b are formed through the insulating oxide 120— one via 122a for making contact with the diffusion area 114 at wafer level, and another via 122b for making contact with the poly 118 over the field oxide area 116. Evidently, the vias 122a and 122b are of unequal depth (even if the insulating layer 120 is subsequently planarized), which causes problems with subsequent via-filling. As mentioned hereinabove, the via 122b to the poly over the field oxide area is shallower by the height (above wafer level) of the field oxide area plus the poly thickness. The problems associated with filling vias of unequal depth are discussed described in commonly-owned U.S. Pat. Nos. 4,708,770 and 4,879,257, incorporated by reference herein.

Another problem is that the top surface of the insulating layer 120 is highly irregular (not smooth and non-planar). This irregular top surface topography will propagate through subsequent depositions, if left unchecked, making subsequent processing steps more complicated (e.g., requiring a planarization step).

As mentioned above, planarizing the isolation and diffusion regions (e.g., by polishing back the oxide prominence) is complicated by the different hardnesses of the isolation oxide and the (essentially silicon) diffusion region. The diffusion region, essentially native silicon, is softer than oxide ($SiO_2$), but a polishing stop can be incorporated over the diffusion region. In either case, material hardness differences are the problem.

Consider, for example, the case of a "fully-sunken" LOCOS oxide structure exhibiting a "Bird's-Beak", as shown in FIG. 4A. In the typical implementation of polishing the LOCOS structure (to remove the "Bird's-Head"), the polishing is stopped before the Bird's Beak is totally removed. This is objectionable, because the Bird's-Beak extends laterally into the diffusion area in the polished structure, as shown in FIG. 4B. The bird's-beak is one of the most objectionable aspects of conventional dielectric isolation schemes, and a polish technique that does not effectively remove this structure, without resorting to deposited dielectric films, is lacking in utility.

DISCLOSURE OF THE INVENTION

It is an object of the present invention to provide improved techniques for forming isolation structures.

It is another object of the present invention to provide a technique for reducing the difference in height between the diffusion area and subsequent poly over the field oxide area, thereby resulting in: a) substantially simpler subsequent creation of contacts through an overlying insulating layer; b) a smoother, more planar top surface topography of the overlying insulating layer; and c) substantially simpler subsequent deposition of metal over the overlying insulating layer.

It is another object of the present invention to provide a technique for creating an isolation structure which is substantially planar with regard to the diffusion region, and which polishes substantially faster than normal thermally-grown field oxide isolation regions.

It is another object of the present invention to provide a technique for using conventional LOCOS dielectric oxidation isolation structure processes, and simultaneously retaining the advantages of planarization by polishing.

It is another object of the present invention to provide an improved bipolar transistor structure, benefiting from the techniques disclosed herein.

According to the invention, an isolation structure between diffusion regions is polished (e.g., using chem-mech polishing techniques) until it is gouged out, below wafer level. A subsequent layer, such as polysilicon, extending over the edge of the diffusion regions and drooping into the gouged out isolation structure exhibits increased uniformity in height above wafer level. This is useful, inter alia, in the filling of vias formed through a subsequent insulating layer.

Further according to the invention, polysilicon or amorphous silicon is used to form an isolation structure. A bathtub (isolation trench) is etched and overfilled with a material selected from the group of polysilicon or amorphous silicon. Polishing proceeds until the isolation structure (within the bathtub) is gouged out below wafer level. Then, the isolation structure is thermally oxidized, and expands to form a substantially planar isolation structure. A thin oxide layer may be formed in the bathtub prior to depositing the polysilicon (or amorphous silicon).

Further according to the invention, an isolation oxide structure, such as a fully-sunk (fully-recessed) oxide structure exhibiting a bird's-head and bird's-beaks, is polished, with polishing continuing until essentially or actually all of the bird's-beak is removed with polishing. In order for this technique to be effective, the isolation oxide is grown to a greater thickness than normal. Gouging in the diffusion area is small, and can be controlled such as by nitride capping.

Further according to the invention, an isolation structure, such as a fully-sunk (fully-recessed) oxide structure exhibiting a bird's-head and bird's-beaks, is polished, with polishing continuing until essentially or actually all of the bird's-beak is removed with polishing. The diffusion area is permitted to be gouged (e.g., no polish stop is incorporated). This allows for bipolar transistor structures to be formed in the diffusion area with reduced collector to (intrinsic) base spacing, and without significantly reduced collector to (extrinsic) base spacing.

Other objects, features and advantages of the invention will become apparent in light of the following description thereof.

Throughout all of the descriptions contained herein, while only one semiconductor structure or isolation structure may be discussed, it should be understood that the invention is applicable to semiconductor devices employing many such structures.

The present invention, in its various embodiments, benefits from the quantitative and qualitative understandings of polishing, as described in the aforementioned U.S. patent application Ser. No. 711,624, entitled TRENCH PLANARIZATION TECHNIQUES and filed on Jun. 6, 1991 by Schoenborn and Pasch, When polishing is referred to herein, it should be understood that it can be abrasive polishing (lapping), as described in U.S. Pat. No. 4,940,507, but is preferably chemi-mechanical (chemmech) polishing as described in U.S. Pat. Nos. 4,671,851, 4,910,155, 4,944,836, all of which patents are incorporated by reference herein. When chemi-mechanical polishing is referred to hereinafter, it should be understood to be performed with a suitable slurry, such as Cabot SC-1.

DETAILED DESCRIPTION OF THE INVENTION

Gouged Field Oxides

Figure 1:
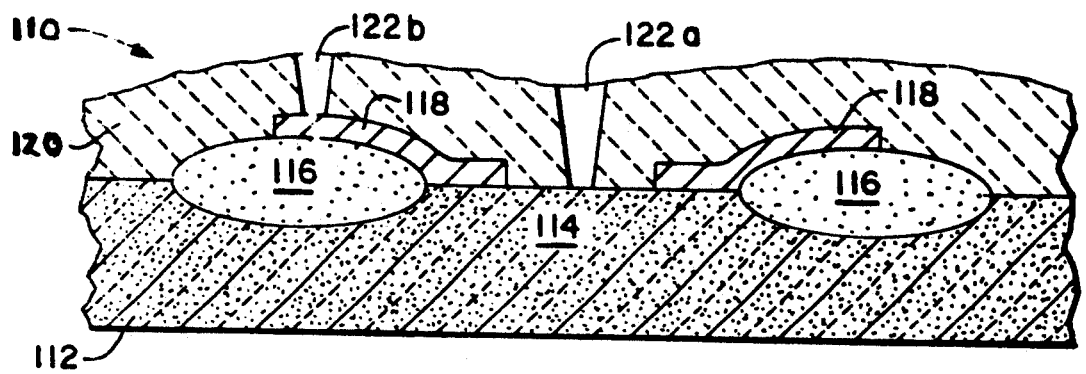
FIG. 1 is a cross-sectional view of a prior art semiconductor device.

FIG. 1, discussed hereinabove, illustrates the problem of vias extending to poly over LOCOS regions being shallower than vias extending to diffusion regions (or to poly over the diffusion region).

Figure 2A:
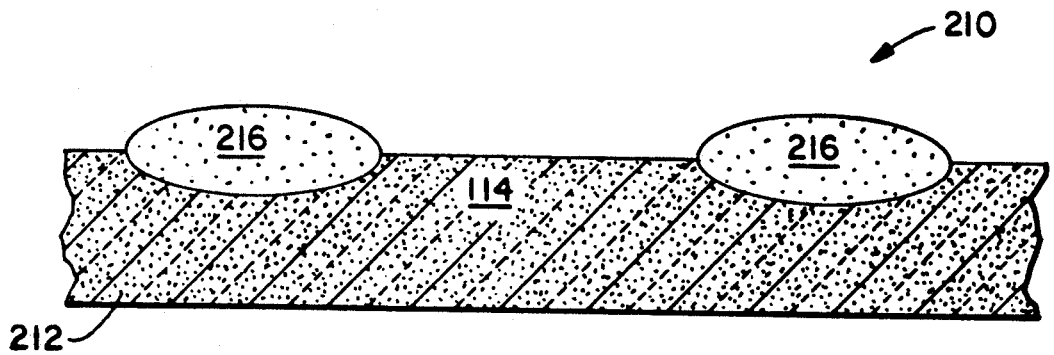
FIG. 2A is a cross-sectional view of an in-process semiconductor device formed by the technique of the present invention.

FIG. 2A shows an in-process semiconductor device 210 formed according to the present invention. The device 210 includes a substrate 212, in which field oxide (e.g., LOCOS) regions 216 are formed adjacent a diffusion (active) region 214. Typically, as illustrated, the LOCOS regions 216 extend prominently above the top surface of the wafer 212, and create an irregular top surface topography. It is known to planarize irregular semiconductor structures at various phases of fabrication by techniques such as abrasive polishing (e.g., lapping), chem-mech polishing and etching. In some cases, sacrificial layers are applied prior to planarization.

Polishing to planarize a field oxide region is feasible, but tends to proceed at a faster rate with respect to the field oxide than with respect to the capped diffusion area, thereby gouging the field softer field oxide. As described in commonly-owned, copending U.S. Pat. No. 711,624, entitled TRENCH PLANARIZATION TECHNIQUES and filed on Jun. 6, 1991, various techniques can be employed to characterize, and therefore implement processes to avoid this seemingly undesirable result.

According to the present invention, it is advantageous to permit gouging the field oxide 216 during polishing, which will be beneficial in further processing steps.

Figure 2B:
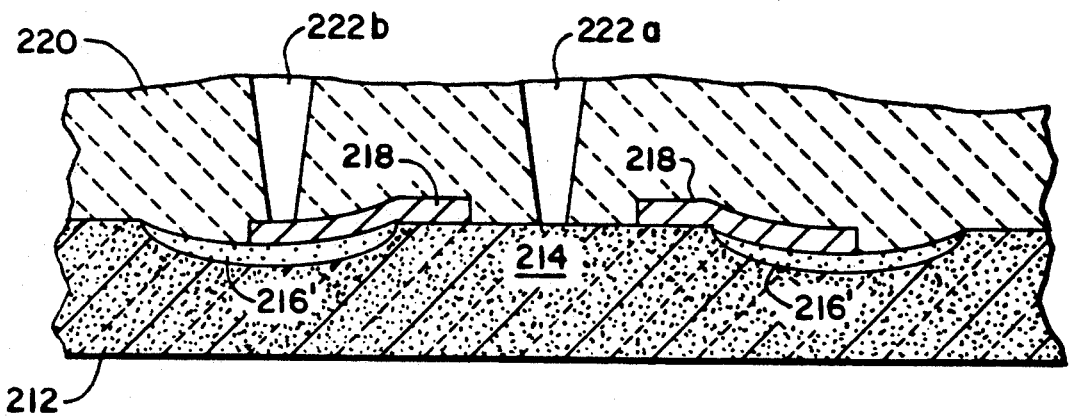
FIG. 2B is a cross-sectional view of the semiconductor device of FIG. 2A, at a later stage in fabrication.

FIG. 2B shows the semiconductor device 210 after polishing (abrasive or chem-mech polishing), wherein it has been permitted that the polishing process gouges the softer field oxide 216 so that its top surface is below wafer level (and consequently below the top surface of the diffusion area 214). The resulting gouged field oxide structure is denoted as 216', and it can be seen that it is "dished" (bowl-shaped). At its inner and outer peripheries, it is at wafer level, and it slopes smoothly down (below wafer level) towards its center. Typical dimensions for this field oxide region are: its width (w) is about 2-5 microns, and its center is depressed a depth (d) about 3000-4000 Å below wafer level. Field oxide regions, generally, can be up to 50 microns wide.

Further illustrated in FIG. 2B, a layer 218, such as patterned poly, is deposited and extends over the diffusion area 214 in at least an area adjacent a gouged field oxide 216', and extends over the gouged field oxide 216' in at least an area adjacent a diffusion area 214. As in FIG. 1, an insulating layer 220 is deposited over the entire device, and vias 222a and 222b are formed through the insulating layer 220 for connecting to the diffusion area 214 and to the poly over the gouged field oxide 216'.

Notably, the vias 222a and 222b are of substantially equal depth, due to the gouging of the field oxide 216'. For example, if the field oxide 216' is gouged to a depth (d) of 3000-4000 Å below wafer level, and the thickness of the poly 218 over the gouged field oxide 216' is 3000-4000 Å thick, then the top surface of the poly over the gouged field oxide 216' will be substantially at wafer level—in other words, level with the top surface of the diffusion area 214.

Further, as a result of gouging the field oxide, the top surface topography of the insulating layer 220 is smoother and more planar (i.e., than shown in FIG. 1, which illustrates the irregular topography of the prior art).

In other words, as shown in FIG. 2B, the polysilicon which extends over the edge of the diffusion region 214 will "droop" down into the gouged out area of the field oxide region 216'. If the gouging is not too great, (e.g., less than the thickness of the polysilicon below the level of the diffusion area), the difference in position of the diffusion area, the top of the polysilicon in the diffusion area, and the top of the polysilicon in the field oxide region will be reduced to only the thickness of the polysilicon. If the gouging is substantially equal to or greater than the thickness of the poly, substantial equality can be achieved between the position of the diffusion area and the poly over oxide.

The significant improvement in the topography of the wafer allows for a more straightforward creation of a planarized deposited silicon dioxide (220) forming the insulation to the first metal layer (not shown). The improvement in the smoothness of the insulating layer can have numerous beneficial effects on the subsequent processing of wafers and on the eventual yield and reliability of the wafer.

While it has been shown that the poly layer (118 of FIG. 1 and 218 of FIGS. 2A and 2B) is segmented, having an opening above the diffusion area (114,214), the poly layer 118, 218) can also extend fully across the diffusion area (114, 214). In that case, a via formed through an overlying insulating layer (120,220) can also extend through the poly layer (118,218). The teachings of the present invention are equally applicable in that case.

Surprisingly, what was previously thought to be an undesirable process side effect (gouging of oxides during polishing) serves as the basis of an improved process. An oxide isolation structure is created which automatically places overlying poly structures in a more advantageous position for subsequent contact formation.

The use of silicon-on-sapphire technology gives somewhat similar advantages, but the complexity and cost are prohibitive. Processes using nitride-guarded sidewalls, such as "SWAMI", for recessed oxides do not as a rule give smooth transitions between the diffusion area and the accompanying field oxide region. Also, these technologies are more complex than the disclosed process.

Oxidized Polysilicon Isolation

FIGS. 3A-3D illustrate a technique for forming substantially planar isolation structures. It will be evident that the process involves some steps resembling those used in the formation of Recessed Oxide Isolation (ROI) techniques, some resembling those used in thermal oxide techniques, as well as some of the techniques described above with respect to FIGS. 2A and 2B.

Figure 3A:
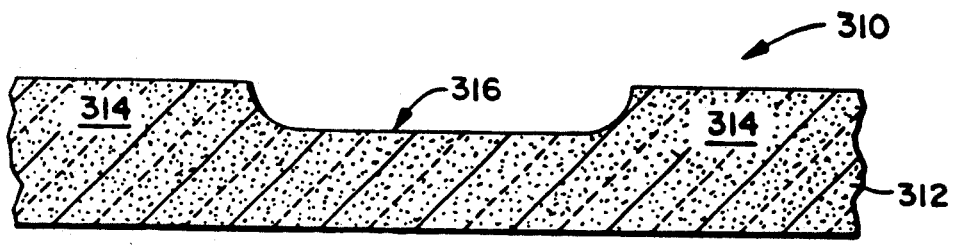
FIG. 3A is a cross-sectional view of an in-process semiconductor structure, according to another embodiment of the invention.

FIG. 3A shows an in-process semiconductor device 310 having a wafer 312. A trench, or "bathtub" 316 is etched into the wafer, in an area which will become the isolation region, and has a depth "h". Diffusion regions 314 are adjacent the inchoate isolation region 316. This stage of the process resembles steps employed in the formation of ROI trench isolation structures, but at this point the process diverges from the teachings of the prior art.

Figure 3B:
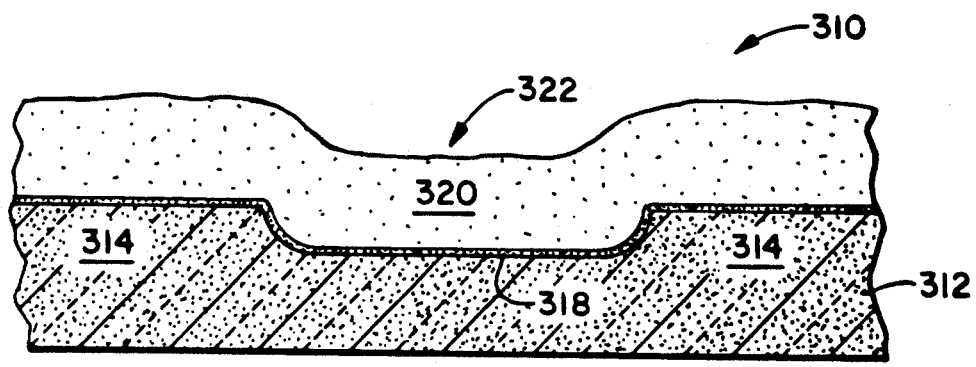
FIG. 3B is a cross-sectional view of the semiconductor structure of FIG. 3A, at a later stage of fabrication.

FIG. 3B shows the next step in the process. The bathtub 316 is preferably lightly oxidized using conventional thermal oxidation processes to grow a very thin layer 318 of thermal oxide in the bathtub, and optionally over the diffusion region (if not capped). By "very thin", it is meant that the thermal oxide layer 318 would be on the order of 400-600 Å, which is significantly less than the depth of the bathtub (and eventual field oxide thickness) which will be on the order of 1500-2000 Å, by way of example. This thin layer of thermal oxide is preferably formed in the bathtub to serve as a stress relief layer for subsequent deposition.

A layer of material 320 selected from the group of amorphous silicon or polysilicon materials is deposited over the thermal oxide layer 318. The layer 320 is deposited to a thickness that is greater than the depth "h" of the bathtub 316, and exhibits a depression (trough) 322 above the bathtub 316. The layer 320 is now polished.

Figure 3C:
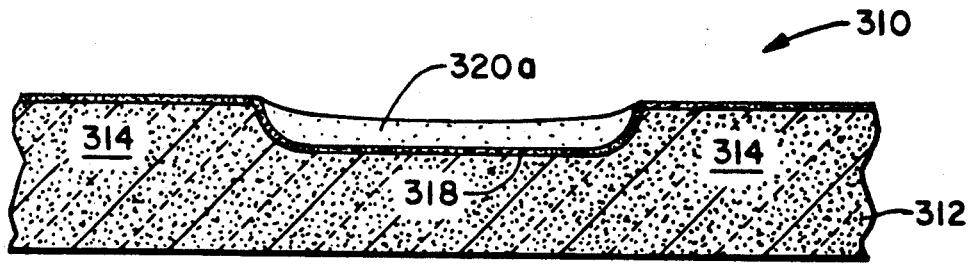
FIG. 3C is a cross-sectional view of the semiconductor structure of FIG. 3B, at a later stage of fabrication.
Figure 3D:
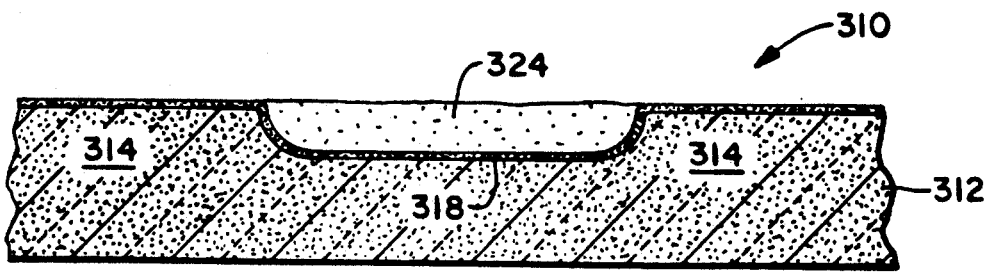
FIG. 3D is a cross-sectional view of the semiconductor structure of FIG. 3C, at a later stage of fabrication.

FIG. 3C shows the layer 320 after it has been polished. A portion 320a of the layer 320 is within the bathtub 316, and is intentionally polished until it is gouged, or depressed below wafer level. Its peripheral edges are substantially at wafer level, and its center is substantially below wafer level. There may also be a thin remnant of the layer 320 remaining over the diffusion areas 314, but it is not shown. In order to control this polishing process, the teachings of the aforementioned U.S. patent application Ser. No. 711,624, entitled TRENCH PLANARIZATION TECHNIQUES and filed by Schoenborn and Pasch, are especially helpful.

At this point, the layer 320a within the bathtub 316 looks like a layer of oxide, but herein the desirability of the use of polysilicon (or amorphous silicon) is revealed.

As shown in FIG. 3C, the portion 320a within the bathtub 316 is thickest at the center of the bathtub 314, and thinner towards the periphery (edge) of the bathtub bordering the diffusion regions 316.

The polished polysilicon 320a (FIG. 3C) is now oxidized in a thermal oxidation furnace. Because of the expansion of polysilicon (or amorphous silicon) upon oxidation, significant changes occur to the topography of the portion 320a. The gouged out area expands (grows) upward, forming a substantially flat isolation structure 324 within the bathtub 316. This is because the structure 320a expands more at its center, where it is thicker, than at its periphery adjacent the diffusion regions 314, where it is thinner. This results in an isolation structure 324, shown in FIG. 3D, that is substantially planar across its entire surface, after thermal oxidation.

The use of polysilicon (or amorphous silicon) for isolation in the manner described above yields beneficial results in the formation of a reasonably planar isolation structure. As mentioned above, the process benefits from various steps that are known in the formation of ROI isolation structures, in the formation of LTO isolation structures, and in the gouging of isolation structures (described hereinabove), with the non-obvious selection of materials for the layer 320.

The invention solves the conventional problem of significant irregular topography of isolation structures, while also solving the problem of gouging the dielectric film inherent in conventional polishing processes. Current processes such as fully-recessed oxide, "SWAMI", and "zero Bird's Head are complicated, and often involve compromises in the quality of the isolation to diffusion interface. The disclosed technique makes fewer compromises to arrive at an excellent topography, and exhibits less stress at the isolation to diffusion interface. This provides a possibility of improving the device packing density, using a process of good productivity and producing adequate device performance.

Although not shown, if polishing proceeds to the point where a layer of polysilicon (or amorphous silicon) remains over the diffusion regions, the remnant over the diffusion regions may be used in the formation of subsequent structures, as desired.

Removing Bird's-Heads and Bird's-Beaks

Figure 4A:
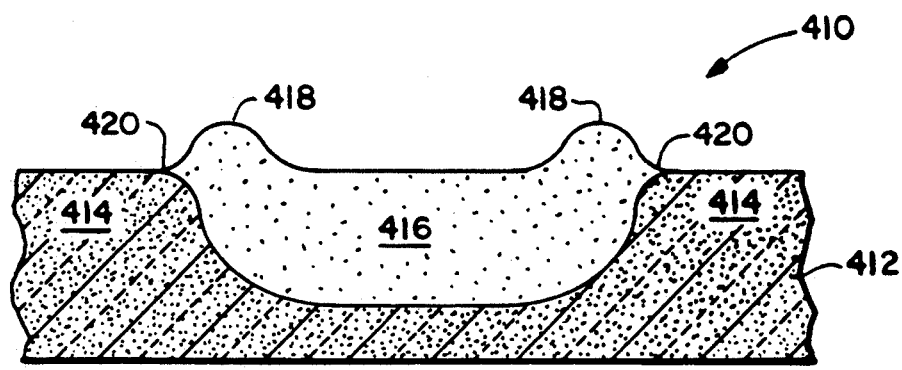
FIG. 4A is a cross-sectional view of a prior art LOCOS, fully-sunk isolation structure, exhibiting a bird's-head and bird's beaks.
Figure 4B:
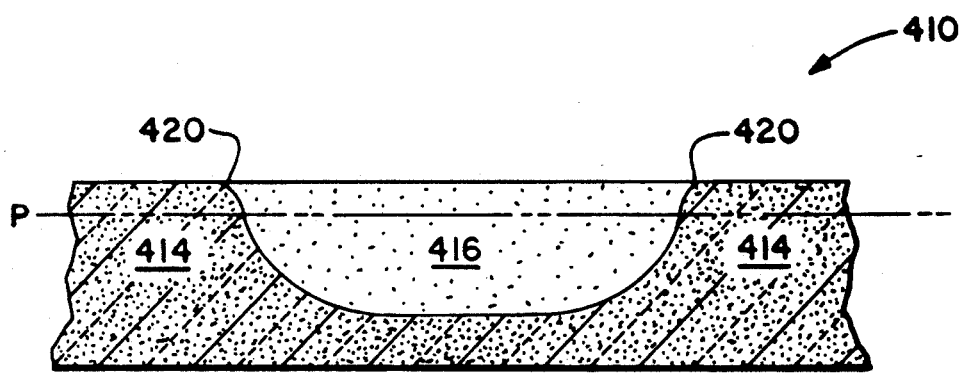
FIG. 4B is a cross-sectional view of the isolation structure of FIG. 4A, after conventional polishing, according to the prior art.

FIGS. 4A and 4B illustrate a prior art technique for creating a LOCOS fully-sunk isolation oxide structure. As shown in FIG. 4A, a semiconductor device 410 has a wafer 412, and a thermally-grown field oxide structure 416 adjacent a diffusion area 414. The oxide structure 416 exhibits bird's-heads 418 and bird's-beaks 420, both adjacent the diffusion areas 414. Bird's-head structures, which are a normal consequence of LOCOS oxidations, are objectionable because they are especially non-planar, and bird's-beaks are objectionable because they intrude upon a significant portion of the diffusion regions, making those portions of the diffusion regions virtually unusable.

FIG. 4B shows the structure after polishing, according to the prior art, and it is evident that the bird's-beaks 420 remain after polishing. This is the situation illustrated in U.S. Pat. No. 4,671,851, entitled METHOD FOR REMOVING PROTUBERANCES AT THE SURFACE OF A SEMICONDUCTOR WAFER USING CHEM-MECH POLISHING TECHNIQUE (Beyer, et al.; 1987).

Bird's-Beaks are described in U.S. Pat. Nos. 4,897,365, 4,912,062, 4,952,525 and 4,959,325, incorporated by reference herein.

According to the present invention, it is possible to use a conventional LOCOS dielectric oxidation isolation structure process, and simultaneously retain the advantages of planarization by polishing. The technique requires that the polishing of the isolation structure be continued until the dielectric film over the diffusion region has been completely removed, as shown in FIG. 4B. Polishing is then continued until essentially or actually all of the bird's-beak 420 is removed with polishing.

Figure 4C:
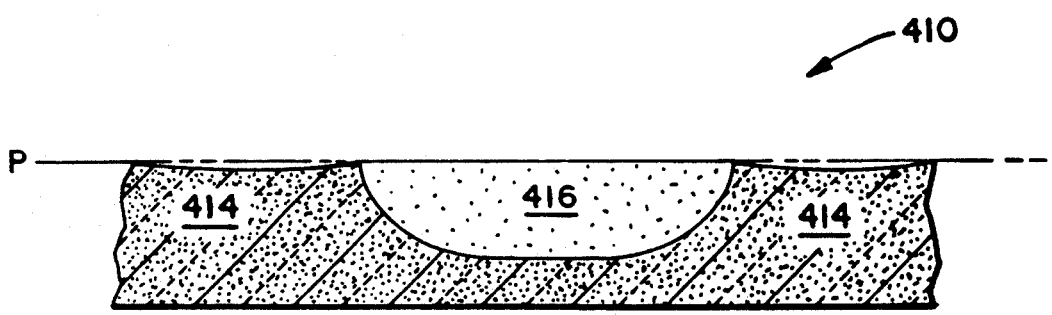
FIG. 4C is a cross-sectional view of a semiconductor structure incorporating the isolation structure of FIG. 4A, after polishing according to the present invention.

The resulting structure is shown in FIG. 4C. Evidently, the bird's-beaks 420 have been removed, and there is only a minor gouging of the diffusion regions 414. A reference plane "P" is shown by a dashed line in FIGS. 4B and 4C, to illustrate how far polishing must proceed to accomplish the purpose of completely removing the bird's-beaks 420.

The process requires a minor change in the growth of the field oxide for isolation. Preferably the use of a fully-recessed oxide isolation is grown to a somewhat greater thickness than is normally done, such as a few hundred Angstroms greater thickness (i.e., grown to approximately 10% greater thickness than normal). The optimal amount of excess growth is driven by the overall parameters of the particular structure, and can be determined empirically. To some extent, less extra growth results in more efficiency, and the ten percent figure set forth above is nominally optimal.

The combination of the fully sunk oxide isolation and its greater thickness is required to compensate for the material being removed during polishing. (Evidently, as illustrated in FIG. 4C, the trench depth, and hence the oxide thickness in the completed structure has been diminished by the advertent over-polishing.)

This procedure makes the polishing create a structure that has a sharp edge between the diffusion region 414 and the isolation region 416, and there are no bird's-beaks to accommodate in subsequent processing steps.

Because the diffusion area is made of softer silicon crystal material, the diffusion area is expected to polish must faster than the surrounding silicon dioxide isolation area. This phenomenon could be advantageous, depending on the semiconductor process being implemented. However, if gouging the diffusion area is deemed undesirable for a particular process, it may be capped with a polish stop, such as silicon nitride. (The silicon nitride cap can simply be the mask used for etching the isolation trench, and it can be retained to prevent gouging the diffusion region.) An appropriately chosen nitride thickness would largely eliminate any tendency for the polishing to gouge out the diffusion area.

The technique of this invention provides a method of creating an isolation structure which has a smaller than normal transition from diffusion to the oxide material. Further, by effective removal of the bird's-head and bird's-beak structures, more area is available for active elements, and denser circuits are possible.

Prior art polishing techniques (e.g., for removing bird's-heads) typically require CVD deposited dielectric films, which sometimes have questionable electrical characteristics.

This method gives a sharp isolation transition without the problems of stress concentration common with previous methods.

BIPOLAR TRANSISTOR

As illustrated above, in FIGS. 4A–4C, it is possible to polish isolation structures and create substantially planar isolation and diffusion structures. Also, it was noted that the diffusion area can (if not capped, or not adequately capped) take on a perceptible depression in the middle of the diffusion area after polish. Herein is disclosed the formation of a subsequent structure, a bipolar transistor, which benefits from allowing the diffusion region to be depressed (gouged).

Figure 5A:
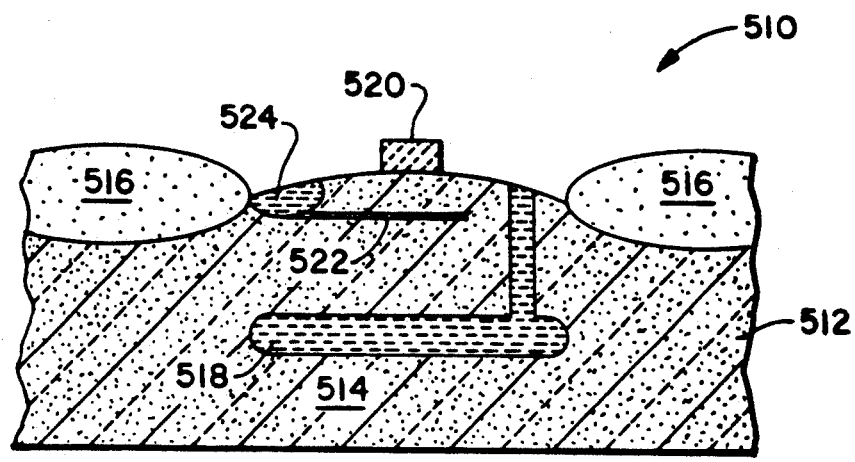
FIG. 5A is a cross-sectional view of a "generic" bipolar transistor of the prior art.

FIG. 5A shows a "generic" bipolar transistor structure 510 of the prior art. A wafer 512 has a diffusion region 514 surrounded by two isolation regions 516. A collector structure 518 is buried within the diffusion region, according to known techniques. An emitter structure 520 is formed atop the diffusion region, according to known techniques. An intrinsic base structure 522 is also formed within the diffusion region, between the emitter and the collector at a given distance from the top surface of the periphery of the diffusion region, according to known techniques. An extrinsic base 524, or "base sink" is formed just within the top surface of the diffusion region, according to known techniques.

As shown in FIG. 5A, the top surface of the diffusion region 514 tends to be "crowned" (i.e., opposite of "gouged"). Hence there is a significant distance between the intrinsic base 52 and the collector 518.

According to the present invention, it is desirable to reduce the spacing between the intrinsic base (522) and the collector (518), without proportionally decreasing the distance between the extrinsic base (524) and the collector (518).

Figure 5B:
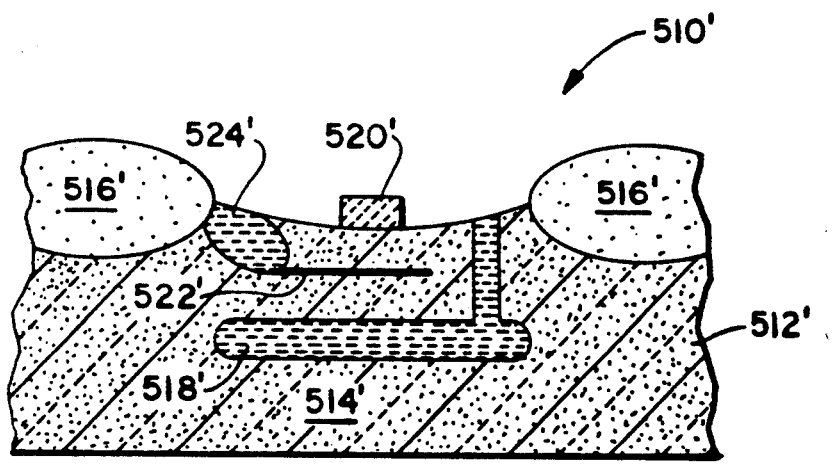
FIG. 5B is a cross-sectional view of a bipolar semiconductor structure, according to the present invention, which is formed based on the inventive polishing technique illustrated in FIG. 4C.

FIG. 5B shows a bipolar transistor structure 510', fabricated according to the present invention. Referring back to FIG. 4C, and the discussion thereof, it was described how the diffusion region 514' could be allowed to become gouged (depressed within the wafer 512'), by polishing without a polish stop. (This accounts for the somewhat more prominent field oxide regions 516' in FIG. 5B than were evident in FIG. 4C.)

As is evident in FIG. 5B, because the diffusion region is gouged, the spacing between the intrinsic base 522' and the collector 518' is reduced, since the intrinsic base 522' is formed at a given distance below the depressed center of the diffusion region 514'. A decrease in intrinsic base to collector spacing on the order of 0.1–0.3 microns, or more, can be achieved, and is very desirable to the basic transistor architecture.

At the same time, the spacing between the extrinsic base 524' and the collector 518' has not been proportionally reduced, since the extrinsic base resides at the periphery of the diffusion region (i.e., upper edge of the bowl), which is virtually at wafer level. This is significant because it would be undesirable to decrease the spacing between the extrinsic base and the collector, which would disadvantageously increase the (extrinsic) base-to-collector capacitance.

In other words, all other process factors being equal (depth of collector below wafer level, depth of intrinsic base below top of diffusion region, position and penetration of extrinsic base), by depressing (gouging) the diffusion region, several advantages to the transistor architecture (and performance) can be derived.

What is claimed is:

1. A method of forming a bipolar transistor structure, comprising:
   on a silicon wafer, thermally forming at least one isolation structure adjacent at least one diffusion area, wherein the diffusion region is substantially at wafer level and the isolation structure extends above wafer level;
   polishing back the isolation structure, and permitting the diffusion area to become gouged and exhibit a depressed top surface topography;
   forming a collector within the diffusion area;
   forming an emitter atop the center of the diffusion area;
   forming an intrinsic base within the diffusion area between the emitter structure and the collector structure;
   forming an extrinsic base just within the top peripheral edge of the diffusion area;
   wherein:
   the spacing between the intrinsic base and collector is reduced without proportionally reducing the spacing between the extrinsic base and the collector.

2. A method according to claim 1, wherein:
   the spacing between the intrinsic base and the collector is reduced on the order of 0.1–0.3 microns.

* * * * *